(12) United States Patent
Murphy

(10) Patent No.: US 11,843,357 B2
(45) Date of Patent: Dec. 12, 2023

(54) OUTPUT CLAMP AND CURRENT LIMITER FOR AMPLIFIER

(71) Applicant: pSemi Corporation, San Diego, CA (US)

(72) Inventor: Christopher C. Murphy, Lake Zurich, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/703,153

(22) Filed: Mar. 24, 2022

(65) Prior Publication Data
US 2023/0308063 A1 Sep. 28, 2023

(51) Int. Cl.
*H03F 3/45* (2006.01)

(52) U.S. Cl.
CPC ..... *H03F 3/45273* (2013.01); *H03F 3/45269* (2013.01); *H03F 2200/462* (2013.01); *H03F 2200/471* (2013.01)

(58) Field of Classification Search
CPC ............. H03F 3/45273; H03F 3/45269; H03F 2200/462; H03F 2200/471

USPC .................................................. 330/252–261
See application file for complete search history.

(56) References Cited

U.S. PATENT DOCUMENTS

| 10,312,899 B2 * | 6/2019 | Roy ...................... H03K 17/687 |
| 2023/0091219 A1 * | 3/2023 | Wenske ................... H02H 3/20 330/298 |

\* cited by examiner

*Primary Examiner* — Hieu P Nguyen
(74) *Attorney, Agent, or Firm* — Steinfl + Bruno LLP

(57) ABSTRACT

Methods and devices for clamping an output of an amplifier stage of an amplifier are presented. According to one aspect, a clamp sense circuit senses a voltage at a node of an internal stage of the amplifier. The clamp sense circuit senses a region of operation of the clamp circuit and correspondingly controls a current limiter that is introduced in the amplifier to limit a current through the internal stage of the amplifier. Limiting the current in turn causes limiting a current path from a clamp circuit through the output of the amplifier stage. According to another aspect, the clamp sense circuit is a replica of the amplifier stage of the amplifier, the output of the amplifier stage coupled to the clamp circuit, and an output of the replica decoupled from the clamp circuit.

23 Claims, 10 Drawing Sheets

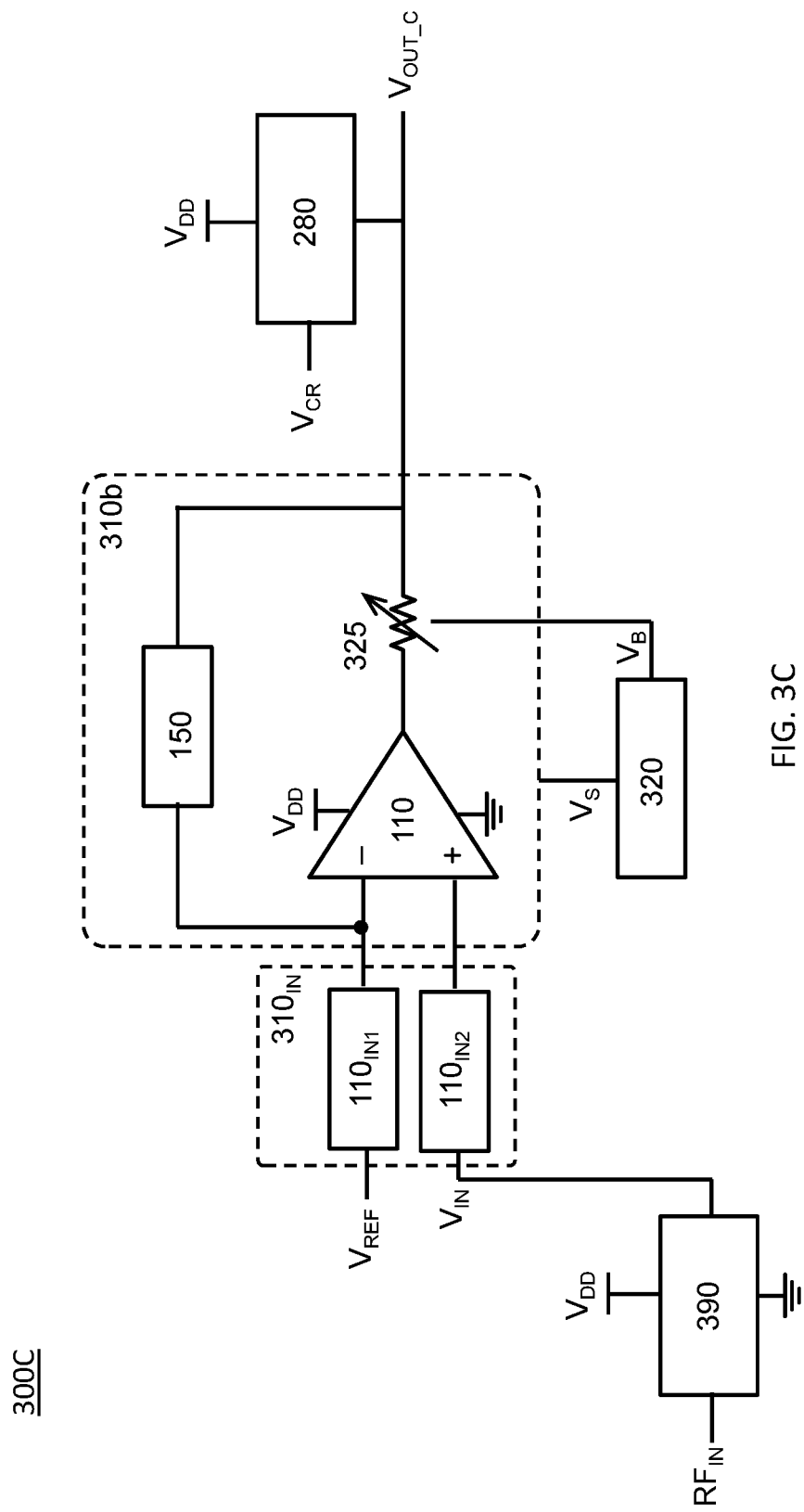

OUTPUT CLAMP AND CURRENT LIMITER FOR AMPLIFIER

TECHNICAL FIELD

The present disclosure is related to electronic circuits, and more particularly to use of a clamp at an output of an amplifier, including an amplifier with a feedback circuit.

BACKGROUND

FIG. 1 shows two exemplary prior art amplifier circuits (100a) and (100b) configured to process an input signal, $V_{IN}$, and produce a corresponding output signal, $V_{OUT}$, when operating from a supply voltage, $V_{DD}$, referenced to a (reference) ground. In particular, the amplifier circuit (100a) includes a single-input single-output amplifier (110a) that may operate to provide a fixed gain between the output signal, $V_{OUT}$ and the input signal, $V_{IN}$. In some cases, such gain may be unity and the amplifier (110a) may be referred to as a buffer. On the other hand, the amplifier circuit (100b) includes a differential-input single-output amplifier (110, e.g., op-amp) that may operate to provide a gain between the output signal, $V_{OUT}$, and the input signal, $V_{IN}$, provided to a positive input terminal of the amplifier (110), such gain being based on a feedback circuit (150) coupled between the output of the amplifier (110) and a negative input terminal of the amplifier (110).

As it is well-known to those skilled in the art, an amplifier, such as the amplifier (110a) or (110) of FIG. 1, may include internal circuits, that may be referred to as "stages", to provide different functionalities of the amplifier, such as, for example, input stage, amplification stage, output stage, driver stage and other. Although such stages may work together to produce a desired gain transfer function of the amplifier, in some cases, when the input signal to the amplifier is not in compliance (e.g., out of range with respect to, for example, a linear region of operation of the amplifier and/or an input voltage range of the amplifier), those stages may produce an output signal that may not be according to an expected gain transfer function and/or that may vary over (operating) temperature and/or over process and fabrication variation.

In order to overcome the above issue arising from non-compliance of an input signal to the amplifier, one may consider coupling the output of the amplifier circuit (e.g., 100a, 100b) to an (active) clamp circuit (280) as shown in the configuration (200) of FIG. 2. The goal of the clamp circuit (280) may be to clamp (e.g., limit) the output signal, in this case a voltage produced by the amplifier circuit (100a), to a predetermined level that is based on a reference clamping voltage, $V_{CR}$, provided to the clamp circuit (280). Such clamping may be in view of a desired minimum or maximum level of the output signal, $V_{OUT\_C}$, that is different from a respective low or high level of the output signal (e.g., $V_{OUT}$ of FIG. 1) produced by the amplifier circuit (100a) for a non-compliant input signal. Accordingly, for an applied input signal, $V_{IN}$, that produces an output signal with a level that is higher (or lower) than a clamped level, the clamped output signal, $V_{OUT\_C}$, may be according to the amplifier transfer function since the clamp circuit (280) is deactivated. On the other hand, for a non-compliant input signal, or for an applied input signal, $V_{IN}$, that produces an output signal with a level that is lower (or higher) than the clamped level, the clamped output signal, $V_{OUT\_C}$, may be at the clamped level, the clamped level being based on (e.g., equal to) the reference clamping voltage, $V_{CR}$.

However, when activated, the clamp circuit (280) as shown in FIG. 2 may create a contention with normal operation of the amplifier circuit (100a) as dictated by (internal) stages of the amplifier (110a), which contention may be further accentuated in the case of the amplifier circuit (100b) of FIG. 1 by presence of the feedback circuit (150). In other words, the stages of the amplifier (110a), and/or of the amplifier (110) with the feedback circuit (150) of FIG. 1, may operate against the clamp circuit (280) and continue to force the output signal, $V_{OUT\_C}$, to a level that the amplifier has established based on the non-compliant input signal. Such contention in turn may not only fail to reproduce the desired clamping effect but may also generate high currents flowing through the clamp circuit (280) and one or more of the stages of the amplifier (110a) with undesired and even damaging effects. Removing such contention, and therefore related effects, is a motivation of the teachings according to the present disclosure.

SUMMARY

According to a first aspect of the present disclosure, a circuit is presented, the circuit comprising: an amplifier comprising one or more stages; a clamp sense circuit coupled to a sensing node of the amplifier; and a current limiter comprising two terminals in series-connection with a first current conduction path of a first stage of the one or more stages, wherein the clamp sense circuit is configured to control the current limiter to limit a current through the first current conduction path of the first stage based on a voltage at the sensing node.

According to a second aspect of the present disclosure, a method for clamping an output of an amplifier is presented, the method comprising: coupling a current limiter in series-connection with a first conduction path of a first stage of the amplifier; sensing a voltage at a node of the amplifier; and based on the sensing, controlling the current limiter to limit a current through the first current conduction path, wherein the voltage sensed at the node of the amplifier controls a current through a second current conduction path of a second stage of the amplifier.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 3C shows an RF power detector circuit coupled to the circuit of FIG. 3B.

Like reference numbers and designations in the various drawings indicate like elements.

DETAILED DESCRIPTION

Figure 1:
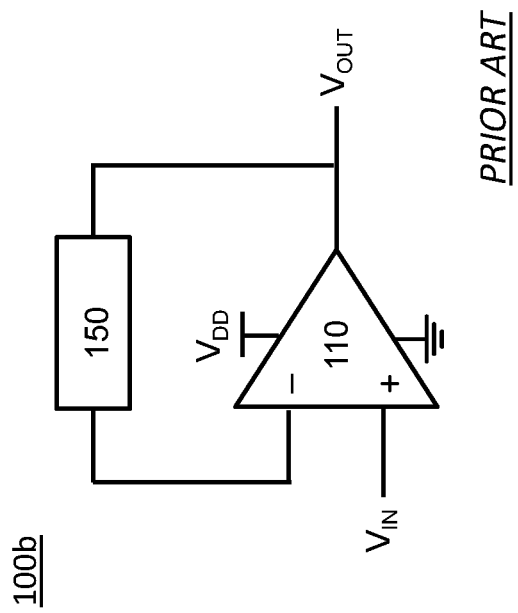
FIG. 1 shows two exemplary prior art amplifier circuits.
Figure 1:
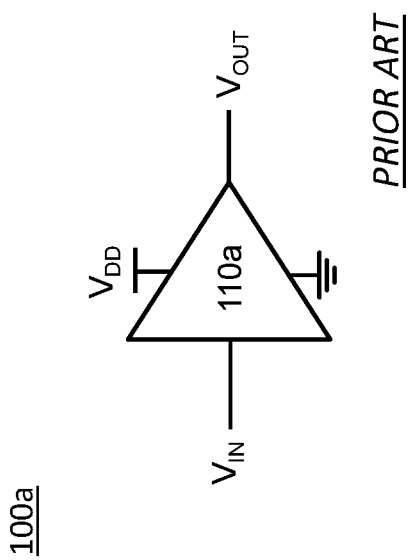
Figure 2:
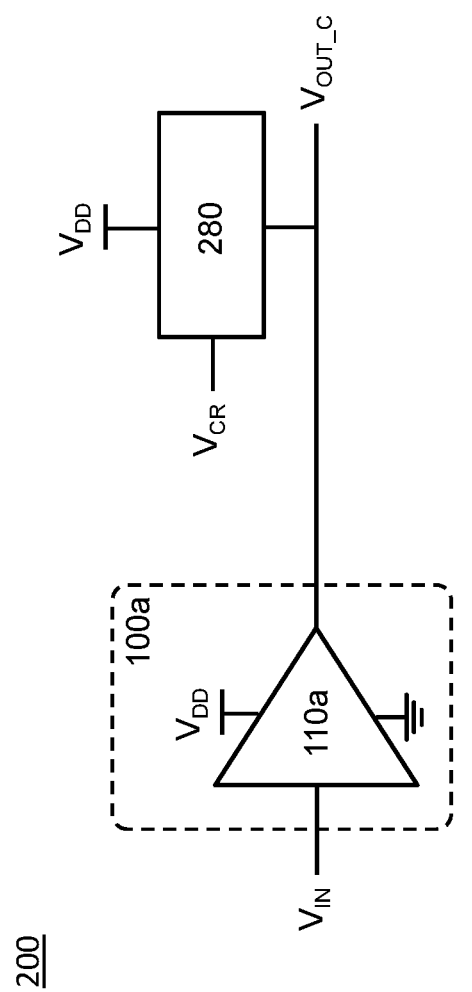
FIG. 2 shows a clamp circuit coupled to an output of a prior art amplifier circuit.

The term "amplifier" as used in the present disclosure is intended to refer to an electronic device comprising a number of transistors used to process an input signal, either a voltage or a current signal, and produce a corresponding output signal that is based on a transfer function of the amplifier. As used in the present disclosure, an amplifier can produce an output signal of greater or equal magnitude than the magnitude of the input signal. An amplifier as used herein can refer to an operational amplifier, a difference amplifier, an error amplifier, a buffer, or other. As used herein, the term "amplifier" can also be applicable to amplifier modules and/or power amplifier modules having any number of cascaded amplifier stages (e.g., pre-driver, driver, final), as known to those skilled in the art, and operating over frequency ranges from DC to RF frequencies.

Teachings according to present disclosure remove the above-described contention between normal operation of an amplifier and a clamp circuit coupled to an output of the amplifier by detecting/sensing a region of operation (e.g., activation) of the clamp circuit and accordingly disabling one or more internal stages, or portions of such stages. According to an embodiment of the present disclosure, such disabling may be based on reducing, limiting, and/or removing one or more current paths through one or more stages of the amplifiers. According to an embodiment of the present disclosure, a current (conduction) path through an output of a stage (e.g., of any stage, including a last/output stage) of the amplifier that is coupled to the clamp circuit may be controlled such as to limit a magnitude of a current through the current path. According to an embodiment of the present disclosure, a magnitude of a current through a current path between the clamp circuit and the output of a stage of the amplifier may be limited.

According to an exemplary embodiment of the present disclosure, the stage of the amplifier that is coupled to the clamp circuit may be provided by a common-source amplifier stage. According to an exemplary embodiment of the present disclosure, the common-source amplifier stage may comprise a current source load in series-connection with a common-source FET transistor. According to an embodiment of the present disclosure, the common-source FET transistor may be controlled to operate as a voltage-controlled resistor (e.g., a current limiter) to gradually limit a current (conduction) path (e.g., limit a magnitude of a current) through the common-source amplifier stage and therefore limit a current path from the clamp circuit through the common-source FET transistor. According to an embodiment of the present disclosure, such controlling of the common-source FET transistor may be based on an output of a clamp sense circuit that is configured to detect/sense the region of operation of the clamp circuit.

According to an embodiment of the present disclosure, the clamp sense circuit may control a current through a first stage (e.g., input stage, intermediate stage, etc.) of the amplifier that provides input to the (second) stage (e.g., output stage of the amplifier) whose output is coupled to the clamp circuit. According to an embodiment of the present disclosure, the first stage may include a push-pull configuration provided by series connection of an n-type and a p-type FET. According to an exemplary embodiment of the present disclosure, each of the n-type and p-type FETs may correspond to an output leg of a respective n-type and p-type current mirror. According to an exemplary embodiment of the present disclosure, the first stage and the second stage may be stages of any n-stage amplifier, including a 2-stage or a 3-stage amplifier known to those skilled in the art. It should be noted that the present teachings may equally apply to any two stages of an n-stage amplifier, including a first stage driving a second stage, with an output of the second stage coupled to a clamp circuit.

According to an embodiment of the present disclosure, a (clamp) current limiter is introduced in the first stage of the amplifier, the current limiter (e.g., voltage-controlled resistor) of the first stage controlled by an output of the clamp sense circuit. According to an embodiment of the present disclosure, the current limiter of the first stage may be coupled in series between the n-type and p-type FETs of the first stage. According to an embodiment of the present disclosure, the output of the clamp sense circuit may control the current limiter of the first stage of the amplifier to gradually reduce and finally limit, or even remove, conduction of current through the first stage, in particular, between the n-type and p-type FET transistors. As current conduction is reduced/limited/removed through the first stage, the first stage may correspondingly control the current limiter of a second stage (e.g., the output stage) to reduce/limit conduction of current through the second stage, in particular, through the common-source FET of the second stage.

According to an embodiment of the present disclosure, the clamp sense circuit may be a replica circuit of the second stage that is similarly coupled to the first stage but decoupled from the clamp circuit. According to an exemplary embodiment of the present disclosure, the replica circuit may be a reduced-size replica circuit of the second stage, including, for example, a ratiometrically reduced-size replica circuit of the second stage. According to an embodiment of the present disclosure, the reduced-size replica circuit may include a reduced-size current source load in series-connection with a reduced-size common-source FET transistor.

According to an embodiment of the present disclosure, the clamp sense circuit may detect/sense a region of operation of the clamp circuit by generating an output voltage that is different from an output voltage generated by the (clamped) second (e.g., output) stage. According to an embodiment of the present disclosure, the first stage may resist clamping of the second stage by increasing a voltage output by the first stage, which in turn decreases a voltage output by the clamp sense circuit. According to an embodiment of the present disclosure, a difference between a voltage output by the clamp sense circuit and a voltage output by the first stage may control the current limiter of the first stage. According to an embodiment of the present disclosure, an increasing difference between such two voltages may gradually limit current through the current limiter of the first stage of the amplifier. Limiting of the current through the current limiter of the first stage may in turn limit a voltage output by the first stage of the amplifier and therefore control the current limiter of the second stage.

Figure 3A:
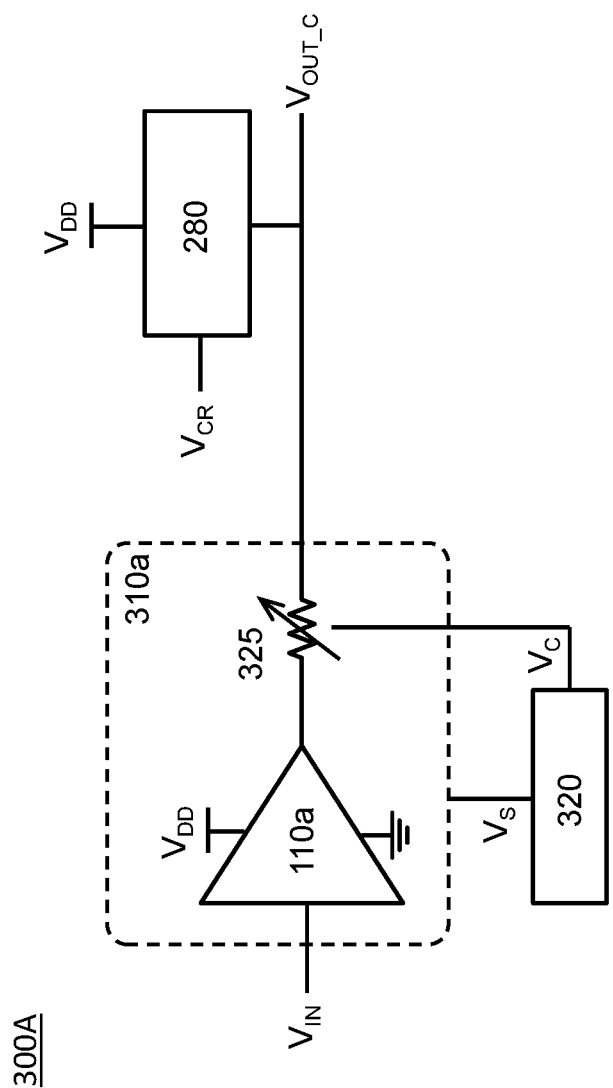
FIG. 3A shows a clamp circuit coupled to an output of an amplifier circuit comprising a clamp current limiter according to an embodiment of the present disclosure.

FIG. 3A shows a clamped amplifier circuit (300A) comprising a clamp circuit (280) coupled to an output of an amplifier circuit (310a) according to an embodiment of the present disclosure. As shown in FIG. 3A, the amplifier circuit (310a) may include an amplifier (110a, e.g., an amplifier stage) coupled to a (clamp) current limiter (325). According to an embodiment of the present disclosure, operation of the current limiter (325) may be based on an output of a clamp sense circuit (320) coupled to the current limiter (325). According to an embodiment of the present disclosure, the clamp sense circuit (320) may sense a region of operation of the clamp circuit (280) and may accordingly control the current limiter (325) to limit a current that flows from the clamp circuit (280) to the amplifier (110a). By limiting, including gradual reducing and limiting, the current that flows from the clamp circuit (280) to the amplifier (110a), a level of the output voltage, $V_{OUT\_C}$, can be dictated by the clamp circuit (280) when latter is activated. On the other hand, when the clamp circuit (280) is not activated, the clamp sense circuit (320) may control the current limiter (325) to provide an operating (e.g., low impedance) current path such that an output of the amplifier (110a) may set a level of the output voltage, $V_{OUT\_C}$.

With continued reference to FIG. 3A, according to an embodiment of the present disclosure, the clamp sense circuit (320) may sense the region of operation of the clamp circuit (280) by sensing a voltage, Vs, from the amplifier circuit (310a), and generate therefrom a voltage, $V_C$, to control the current limiter (325) to limit the current through the current limiter (325). According to an embodiment of the present disclosure, the current limiter (325) may include a FET transistor that may be controlled to operate according to a voltage-controlled resistor. Accordingly, during a deactivated condition of the clamp circuit (280), the current limiter (325) may be controlled to provide a low resistance, and during an activated condition of the clamp circuit (280), the current limiter (325) may be controlled to provide a high resistance. In other words, during the deactivated condition of the clamp circuit (280), the current limiter (325) may be likened to a switch in the closed state (e.g., having a low ON resistance), and during the activated condition of the clamp circuit (280), the current limiter (325) may be likened to a switch in the open state (e.g., having a high OFF resistance).

With further reference to FIG. 3A, according to a non-limiting embodiment of the present disclosure, the current limiter (325) may be designed as part of a stage of the amplifier circuit (310a), including for example, as part of an output stage that is configured to connect (directly couple) to the clamp circuit (280), or as part of any internal stage (not shown in FIG. 3A) of the amplifier (110a). According to an embodiment of the present disclosure, the amplifier circuit (310a) may include an additional one or more current limiters (not shown in FIG. 3A) that may be part of one or more stages of the amplifier circuit (310a), including stages of the amplifier (110a). According to an embodiment of the present disclosure, the clamp sense circuit (320) may control operation of one current limiter (e.g., part of a first stage of the amplifier), and other one or more current limiters (e.g., part of second, third, etc., stages of the amplifier) may be slaved to the one current limiter. In other words, a current through the other one or more current limiters may be controlled by a current through the one current limiter. In other words, when current through the one current limiter is limited/reduced/removed, a respective current through each of the other one or more current limiters is limited/reduced.

With continued reference to FIG. 3A, the sensing voltage, Vs, may be from any suitable node of the amplifier circuit (310a), including, for example, from a node of a first (internal) stage of the amplifier (110a). According to an embodiment of the present disclosure, the clamp sense circuit (320) may include a circuit that replicates a portion of, or entirety of, a second stage of the amplifier circuit (310a) that is coupled to the sensing voltage, Vs. According to an embodiment of the present disclosure, when input to the clamp sense circuit (320), the sensing voltage, Vs, may produce a voltage that is different from a voltage produced by the first stage of the amplifier circuit (310a). According to an embodiment of the present disclosure, such difference in voltage may be used to control operation of the current limiter (325). According to an embodiment of the present disclosure, such difference in voltage may be provided to the current limiter (325) by a combination of the control voltage, $V_C$, and a voltage output by the amplifier (110a).

Figure 3B:
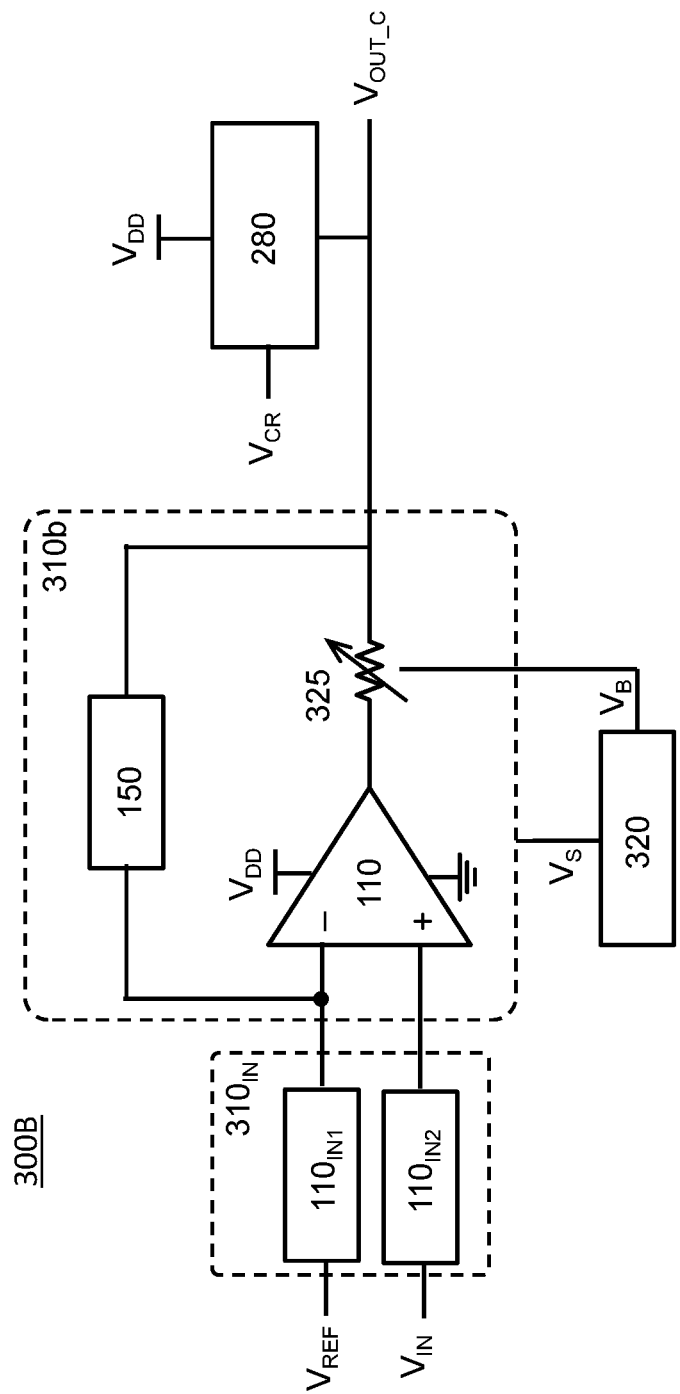
FIG. 3B shows a clamp circuit coupled to an output of another amplifier circuit comprising a clamp current limiter according to an embodiment of the present disclosure.

FIG. 3B shows a clamped amplifier circuit (300B) comprising a clamp circuit (280) coupled to an output of an amplifier circuit (310b) according to an embodiment of the present disclosure. As shown in FIG. 3B, the amplifier circuit (310b) may include an amplifier (110, e.g., an amplifier stage) coupled to a (clamp) current limiter (325). Furthermore, the amplifier circuit (310b) may include a feedback circuit (150) coupled between an output of the amplifier circuit (310b) and the negative input terminal of the amplifier (110). The clamped amplifier circuit (300B) may be likened to the clamped amplifier circuit (300A) of FIG. 3A for a case where a feedback circuit (e.g., 150) is provided. Accordingly, operation of the clamp sense circuit (320) and the current limiter (325) of FIG. 3B may be likened to operation of same as described above with reference to FIG. 3A. Accordingly, the clamp sense circuit (320) and the current limiter (325) of FIG. 3B, in combination, may limit/reduce a current path (e.g., a magnitude of a current through the current path) from the clamp circuit (280) to the amplifier (110) during activation of the clamp circuit (280). As noted above, activation of the clamp circuit (280) may be in view, for example, of a non-compliant input (e.g., $V_{IN}$) applied to the amplifier (110), in which case the clamp circuit (280) forces a level of the output voltage, $V_{OUT\_C}$, to a clamped level that is based on (e.g., equal to) the reference clamping voltage, $V_{CR}$. It should be noted that teachings according to the present disclosure may equally apply to a clamp circuit, or a pair of clamp circuits, configured to clamp the output of the amplifier (110) for high- and low-level conditions responsive to a non-compliant input signal. It should further be noted that in some implementations, inputs to the amplifier (110) may be provided through an input block ($310_{IN}$). For the exemplary case of the amplifier (110) shown in FIG. 3B, the input block ($310_{IN}$) may include input networks ($110_{IN1}$) and ($110_{IN2}$) for respective coupling of: a reference voltage, $V_{REF}$, to the negative input terminal of the amplifier (110); and the input voltage, $V_{REF}$, to the positive input terminal of the amplifier (110). As known to a person skilled in the art, such input networks ($110_{IN1}$) and ($110_{IN2}$) may serve to configure the amplifier (110) for operation according to a difference amplifier, wherein the output of the amplifier (e.g., $V_{OUT\_C}$) may be based on a difference between the input voltage, $V_{IN}$, and the reference voltage, $V_{REF}$.

As shown in FIG. 3C, the clamped amplifier circuit (300B) of FIG. 3B, may be coupled to an RF power detector circuit (390) for output of a corresponding clamped output voltage, $V_{OUT\_C}$. The RF power detector (390) may convert an input RF signal, $RF_{IN}$, to a DC voltage having a level that may be proportional to a power level of the input RF signal, $RF_{IN}$. According to an exemplary embodiment of the present disclosure, when no input RF signal, or a non-compliant input RF signal, is applied to the RF power detector (390), the output voltage, $V_{OUT\_C}$, may be clamped to a desired (e.g., low) voltage level.

Figure 4A:
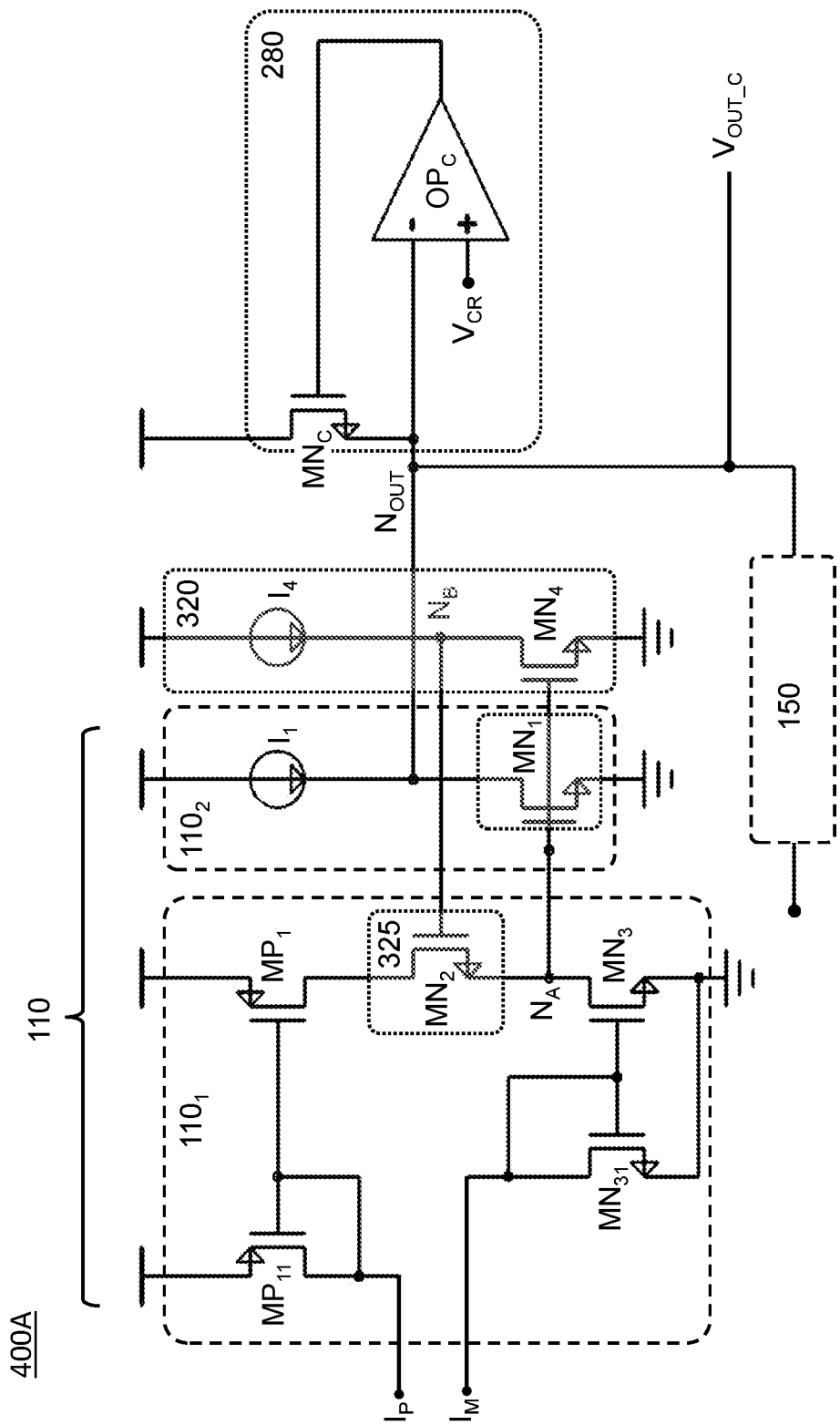
FIG. 4A shows details of an exemplary implementation according to the present disclosure of the embodiment of FIG. 3B.

FIG. 4A shows details of an exemplary implementation of a clamped amplifier circuit (400A) according to the present disclosure based on the clamped amplifier circuit (300B) shown in FIG. 3B. In particular, FIG. 4A shows some details of respective first stage ($110_1$) and second stage ($110_2$) of the amplifier (110); of the clamp sense circuit (320); of a current limiter (325); and of the clamp circuit (280). Furthermore, a block (annotated as 150) is used to represent a feedback circuit (e.g., 150 of FIG. 3B) that is coupled between an output node, $N_{OUT}$, that carries the voltage, $V_{OUT\_C}$, and an input terminal (e.g., negative input terminal of FIG. 3B) of the amplifier (110). In some nonlimiting exemplary embodiment, the feedback circuit (150) may include a resistor divider network that divides the output voltage, $V_{OUT\_C}$, and feeds a divided version of such voltage to the input terminal of the amplifier (110).

According to an exemplary embodiment of the present disclosure, the clamp circuit (280) may include a closed loop circuit ($OP_C$, $MN_C$) that includes an operational amplifier, $OP_C$, coupled to a FET transistor, $MN_C$. As shown in FIG. 4A, the operational amplifier, $OP_C$, may include a negative terminal coupled to the output node, $N_{OUT}$, and a positive terminal coupled to the reference clamping voltage, $V_{CR}$. An output of the operational amplifier, $OP_C$, may be coupled to a gate of FET transistor, $MN_C$, whose drain may be coupled to the supply voltage (e.g., $V_{DD}$ of FIG. 3B) and source coupled to the negative terminal of the operational amplifier, $OP_C$. Accordingly, for a voltage, $V_{OUT\_C}$, at the output node, $N_{OUT}$, that is higher than the reference clamping voltage, $V_{CR}$, the output of the operational amplifier, $OP_C$, is lower than the voltage, $V_{OUT\_C}$, and therefore the FET transistor, $MN_C$, is turned OFF and has no effect on the voltage, $V_{OUT\_C}$. On the other hand, for a voltage, $V_{OUT\_C}$, at the output node, $N_{OUT}$, that is lower than the reference clamping voltage, $V_{CR}$, the output of the operational amplifier, $OP_C$, is higher than the voltage, $V_{OUT\_C}$, and therefore the FET transistor, $MN_C$, is turned ON to clamp the voltage, $V_{OUT\_C}$, at the output node, $N_{OUT}$, to a clamping level that is equal to the reference clamping voltage, $V_{CR}$. So long as a current path from the source of the FET transistor, $MN_C$, through the amplifier (110, e.g., through the second stage $110_2$) may exist, the FET transistor, $MN_C$, may be controlled by the closed loop circuit ($OP_C$, $MN_C$) to increase a current through the output node, $N_{OUT}$, such as to clamp the voltage level at the output node, $N_{OUT}$. As described above, by sensing activation of the clamping circuit (280), the clamp sense circuit (320) may limit/reduce a current through the amplifier (110), and therefore allow clamping of the voltage level at the output node, $N_{OUT}$.

With continued reference to FIG. 4A, the first stage ($110_1$) of the amplifier (110) may include a first current mirror circuit ($MP_{11}$, $MP_1$) and a second mirror circuit ($MN_{31}$, $MN_3$), wherein transistors $MP_{11}$ and $MN_{31}$ receive input currents, $I_P$ and $I_M$, respectively, from a previous stage (not shown as not relevant). In particular, the first current mirror may be a p-type current mirror that includes respective first and second leg p-type FET transistors, $MP_{11}$ and $MP_1$, and the second current mirror may be an n-type current mirror that includes respective first and second leg n-type FET transistors, $MN_{31}$ and $MN_3$. As shown in FIG. 4A, the respective second leg p-type and n-type transistors, $MP_1$ and $MN_3$, may be in series-connection and coupled between the supply voltage (e.g., $V_{DD}$ of FIG. 3B) and the reference ground. On the other hand, the second stage ($110_2$) of the amplifier (110) may include a current source, $I_1$, in series-connection with a common-source FET transistor, $MN_1$. As shown in FIG. 4A, an output of the first stage ($110_1$) may be coupled to an input of the second stage ($110_2$) at a first stage output node, NA.

According to a nonlimiting embodiment of the present disclosure, the first and second stages ($110_1$, $110_2$) shown in FIG. 4A, may be stages of an n-stage amplifier, such as, for example, a 2-stage amplifier circuit as known in the art, modified for operation according to the present disclosure. In particular, the first stage ($110_1$) may output a voltage at the first stage output node, NA. In turn, the voltage at the first stage output node, NA, may drive the second stage ($110_2$) for output of a corresponding output voltage at the output node, $N_{OUT}$. In the exemplary configuration shown in FIG. 4A, the first stage ($110_1$) may arbitrarily be referred to a drive stage to the second stage ($110_2$), and the second stage ($110_2$) may arbitrarily be referred to a as an output stage of the amplifier (110).

According to an embodiment of the present disclosure, the first stage ($110_1$) may be modified to include an n-type FET transistor, $MN_2$, in series-connection between the respective second leg p-type and n-type transistors, $MP_1$ and $MN_3$. In the absence of the n-type FET transistor, $MN_2$, as the clamping circuit (280) is activated, it may try to impose the clamping voltage level at the output node, Nom', while the first stage ($110_1$) may try to impose a different voltage level (e.g., lower level) at the output node, $N_{OUT}$, based for example, on a feedback voltage provided to an input of the amplifier (110) via the feedback circuit (150). Accordingly, the first stage ($110_1$) may increase a voltage output at the first stage output node, NA, to further drive the common-source FET transistor, $MN_1$, of the second stage ($110_2$) for an increased current through such transistor. Although the current source, $I_1$, may be limited in output current sourcing capability, a current from the supply voltage through the FET transistor, $MN_C$, of the clamping circuit (280) may not be limited, and therefore may freely flow through the common-source FET transistor, $MN_1$. By including the n-type FET transistor, $MN_2$, in series-connection between the respective second leg p-type and n-type transistors, $MP_1$ and $MN_3$, such increasing of the voltage output at the first stage output node, NA, and therefore of the current through the transistors ($MN_1$, $MN_C$), may be controlled/limited.

With continued reference to FIG. 4A, according to an embodiment of the present disclosure, the clamp sense circuit (320) may include a replica circuit of the first stage ($110_1$), including a circuit ($I_4$, $MN_4$) that is a replica of the circuit ($I_1$, $MN_1$) described above. According to a nonlimiting embodiment of the present disclosure, the circuit ($I_4$, $MN_4$) may be a reduced-size replica of the circuit ($I_1$, $MN_1$), the reduced size provided by a ratio of sizes of the current sources $I_1$ and $I_4$, and/or of sizes of the transistors $MN_1$ and $MN_4$.

As shown in FIG. 4A, the circuit ($I_1$, $MN_1$) and its replica circuit ($I_4$, $MN_4$) may receive the same input voltage provided at the first stage output node, NA. Accordingly, as the voltage at the first stage output node, NA, may increase in response to activation of the clamping circuit (280), the transistor $MN_4$ may be controlled for further current conduction and therefore a voltage at the node NB may decrease (e.g., since drain-to-source voltage of $MN_4$ may decrease) and may eventually become closer to the voltage at node NA (source voltage of $MN_2$). Accordingly, the gate of the n-type FET transistor, $MN_2$, decreases while its source, which is at the voltage level of the first stage output node, NA, increases. In turn, this gradually causes the n-type FET transistor, $MN_2$, to turn close to, or even into, its OFF state, which therefore gradually limits or removes the current conduction path from the p-type transistor $MP_1$ (that is coupled to the supply voltage, $V_{DD}$ of FIG. 3B) through the n-type transistor, $MN_3$. Accordingly, the voltage at the first stage output node, NA, remains at a level in this condition for which transistor $MN_1$ of the second stage ($110_2$) maintains a limited and controlled current to exactly balance current from the clamp circuit (280) and permit a voltage at the output node, $N_{OUT}$, to be equal to the reference clamping voltage, $V_{CR}$. Accordingly, the clamp circuit (280) may control a voltage at the output node, $N_{OUT}$, to be equal to the reference clamping voltage, $V_{CR}$.

Figure 4B:
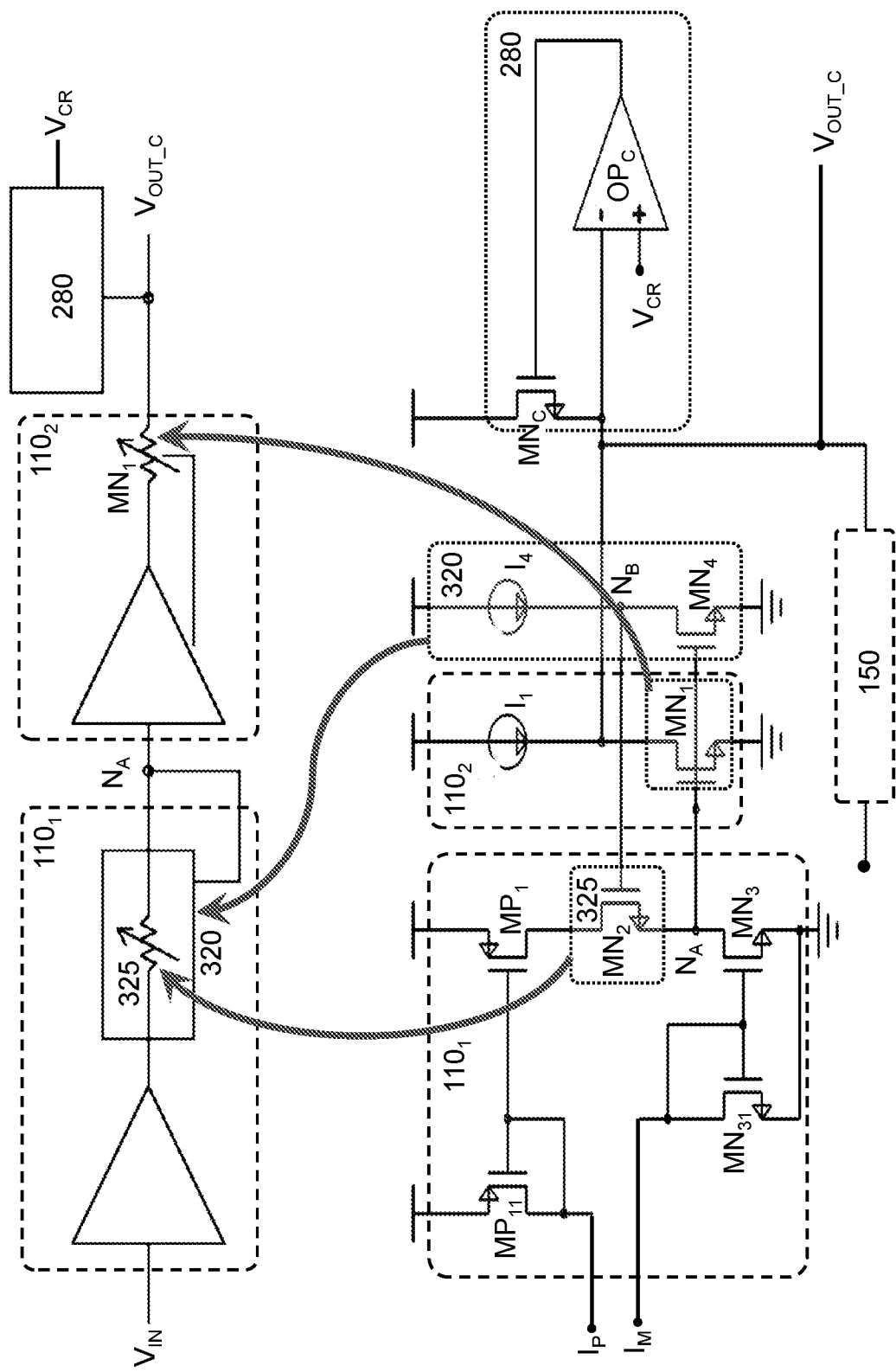
FIG. 4B shows mapping of the details shown in FIG. 4A to functional blocks of a clamped amplifier circuit according to the present disclosure.

Mapping of the details shown in FIG. 4A to functional blocks of a clamped amplifier circuit described herein are shown in FIG. 4B. As shown in FIG. 4B, the sensing circuit (320), senses a voltage at the node, NA, of the first stage ($110_1$, and common to the second stage $110_2$), and generates a corresponding output voltage at the node, NB, that controls the n-type transistor, $MN_2$, which may be likened to a current limiter (325). Under control of the clamp sense circuit (320), the current limiter (325), gradually changes (increases) its resistance till limited, or substantially no, current flows through it. This gradual decrease of current through the current limiter (325) may in turn gradually limit the current through the n-type transistor, $MN_1$, of the second (e.g., output) stage ($110_2$), whose operation under the clamping region may also be likened to a current limiter, or a voltage-controlled resistor.

Figure 4C:
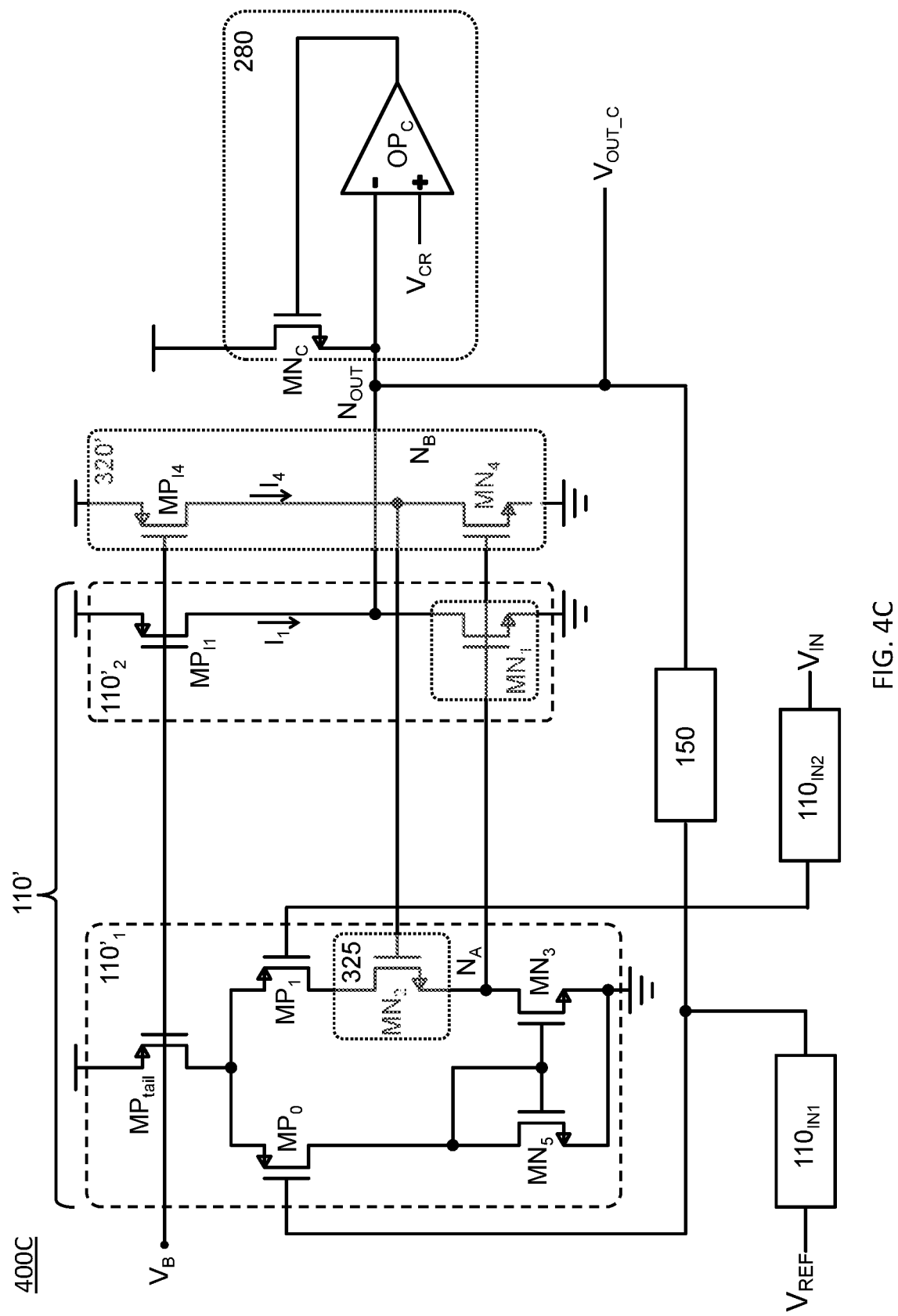
FIG. 4C and FIG. 4D shows details of other exemplary implementations according to the present disclosure of the embodiment of FIG. 3B.

As noted above, teachings according to the present disclosure may apply to stages of any amplifier configuration, and therefore the above-described stages ($110_1$, $110_2$) of the exemplary amplifier (110) with reference to FIG. 4A should not be considered as limiting the scope of the present disclosure. For example, FIG. 4C shows details of another exemplary implementation of a clamped amplifier circuit (400C) according to the present disclosure that is based on the clamped amplifier circuit (300B) shown in FIG. 3B but implemented for an amplifier (110') that is different from the amplifier (110) of FIG. 4A. In particular, stages ($110'_1$, $110'_2$) of the amplifier (110') may include a well-known in the art differential input stage ($110'_1$) whose output drives an output stage ($110'_2$) that may also be likened to the common-source amplifier stage ($110_1$, with common-source input transistor $MN_1$) of FIG. 4A, with a current source provided by common-source p-type transistor, $MP_{11}$ (e.g., output leg of a current mirror) instead of the current source $I_1$ of FIG. 4A. In such amplifier configuration (110'), input to the differential input stage ($110'_1$) may be provided via respective p-type transistors ($MP_0$, $MP_1$) coupled to a current source, $MP_{tail}$, that may also be part (e.g., output leg) of a current mirror (not shown in FIG. 4C). As shown in FIG. 4C, a current source control voltage, VB, may be coupled to gates of transistors $MP_{tail}$, $MP_{11}$, $MP_{14}$, for output of scaled currents based on sizes of the transistors. Output of the differential input stage ($110'_1$) may be provided by p-type and n-type transistors, $MP_1$ and $MN_3$, arranged in series-connection and coupled between the supply voltage (e.g., $V_{DD}$ of FIG. 3B) and the reference ground. As shown in FIG. 4C, output clamping and current limiting according to the present disclosure may be provided by the replica circuit (320') of the stage ($110'_2$) that in combination with the transistor, $MN_2$, that is coupled between transistors, $MP_1$ and $MN_3$, of the stage ($110'_1$), may provide same functionality as described above with reference to elements ($110_1$, $110_2$, $MN_2$) of FIG. 4A.

Figure 4D:
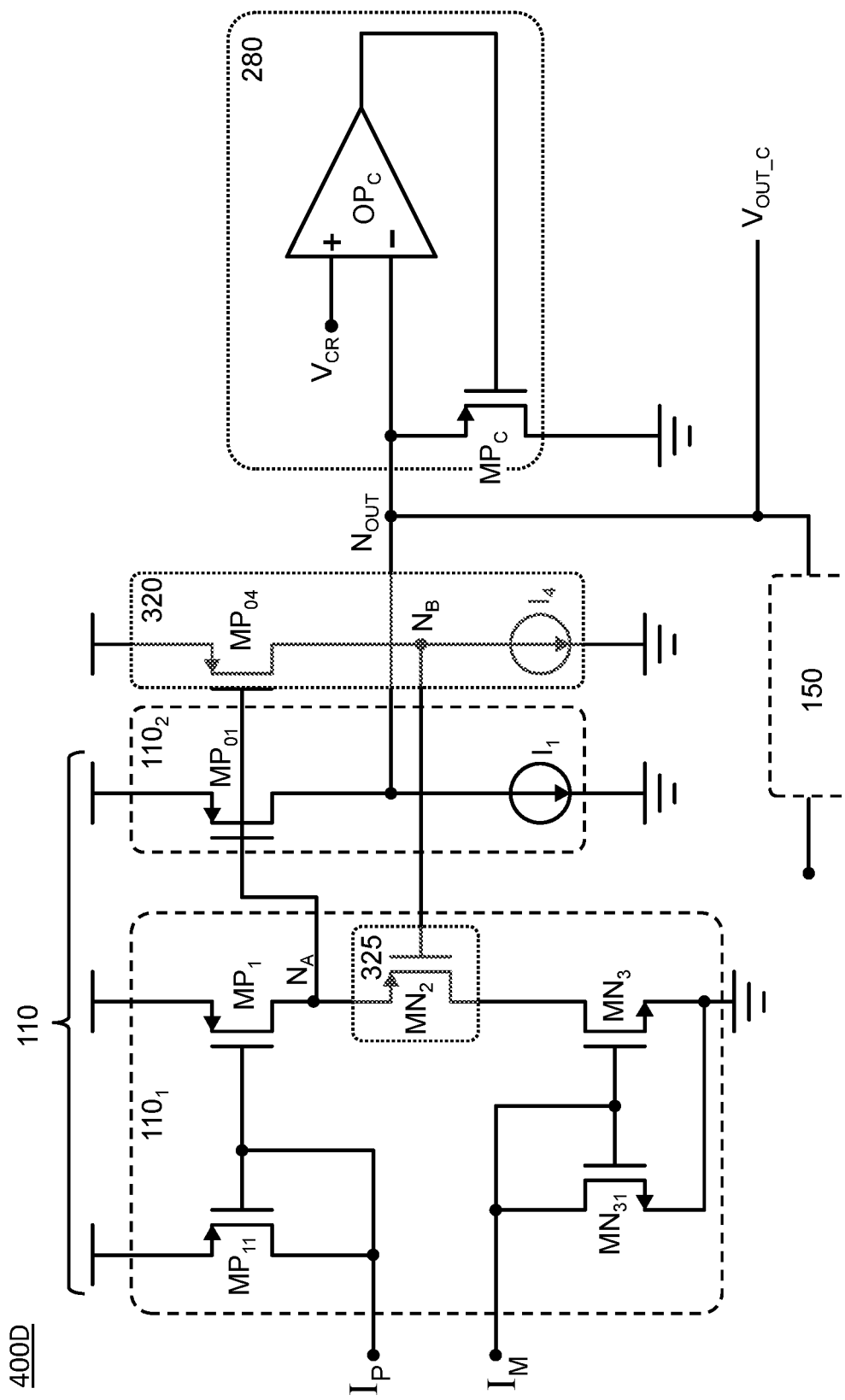

As noted above, teachings according to the present disclosure may equally apply to a clamping circuit that clamps the output of the amplifier to a low clamp level (does not allow output of the amplifier to get lower than the low clamp level) and/or to a high clamp level (does not allow output of the amplifier to get higher than the high clamp level). The exemplary configurations (400A) and (400C) described above with reference to FIG. 4A and FIG. 4C consider a low clamp level. On the other hand, the configuration (400D) of FIG. 4D considers a high clamp level for an amplifier (110) that is similar to one described above with reference to FIG. 4A. A person skilled in the art would clearly realize that the clamping and current limiting according to the present disclosure for a high clamp level as shown in the configuration (400D) may be obtained from the dual configuration (400A) by changing polarities of transistors used in elements (325, $110_2$, 320, 280, $I_1$, $I_4$), as well as the output polarity of the operational amplifier, $OP_C$, of the clamp circuit (280) by reversing inputs to the input terminals of the operational amplifier, $OP_C$. Description above with reference to the configuration (400A) of FIG. 4A may equally apply to the configuration (400D) of FIG. 4D, with the difference that clamping in the configuration (400D) may be activated when a voltage at the node, $N_{OUT}$, is above the reference clamping voltage, $V_{CR}$, provided to the clamp circuit (280). In turn, activation of the clamp circuit (280) may cause the voltage at the node, NB, to increase from a low voltage level during a deactivated state of the clamp circuit (280), to a high voltage level. A person skilled in the art would know how to combine the configuration (400A) of FIG. 4A with the configuration (400D) of FIG. 4D for implementation of concurrent/simultaneous low- and high-level clamping with current limiting according to the present disclosure.

Figure 5:
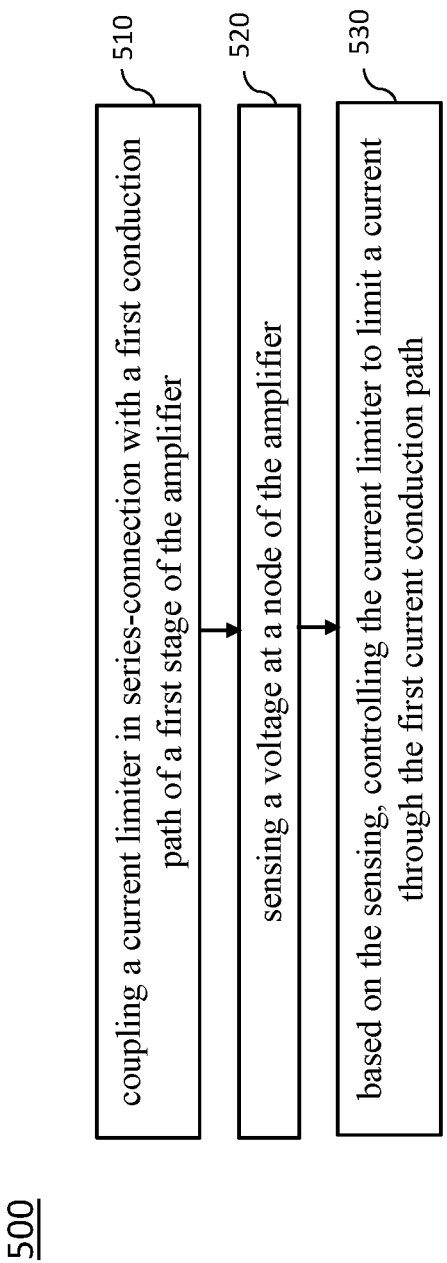
FIG. 5 is a process chart showing various steps of a method according to the present disclosure for clamping an output of an amplifier.

FIG. 5 is a process chart (500) showing various steps of a method according to the present disclosure for clamping an output of an amplifier. As shown in FIG. 5 such steps comprise: coupling a current limiter in series-connection with a first conduction path of a first stage of the amplifier, per step (510); sensing a voltage at a node of the amplifier, per step (520); and based on the sensing, controlling the current limiter to limit a current through the first current conduction path, per step (530), wherein the voltage sensed at the node of the amplifier controls a current through a second current conduction path of a second stage of the amplifier.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms.

Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies.

However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuit, comprising:
an amplifier comprising two or more cascaded stages;
a clamp sense circuit coupled to a sensing node of the amplifier; and
a current limiter comprising two terminals in series-connection with a first current conduction path of a first stage of the two or more cascaded stages,
wherein
the clamp sense circuit is configured to control the current limiter to limit a current through the first current conduction path of the first stage based on a voltage at the sensing node.

2. The circuit according to claim 1, wherein:
the voltage at the sensing node is based on a magnitude of a current that flows through the first current conduction path of the first stage.

3. The circuit according to claim 2, wherein:
the clamp sense circuit is configured to control the current limiter to substantially remove the first current conduction path.

4. The circuit according to claim 3, wherein:
removal of the first current conduction path is based on the voltage at the sensing node reaching a high level.

5. The circuit according to claim 2, wherein:
control of the current limiter is based on a difference between the voltage at the sensing node and a voltage output by the clamp sense circuit.

6. The circuit according to claim 5, wherein:
the current limiter is a FET transistor,
the two terminals of the current limiter are respectively provided by a drain and a source of the FET transistor, and
the voltage output by the clamp sense circuit is coupled to a gate of the FET transistor.

7. The circuit according to claim 1, wherein:
the clamp sense circuit comprises a replica circuit of a second stage of the two or more cascaded stages, the second stage comprising a second current conduction path that is different from the first current conduction path.

8. The circuit according to claim 7, wherein:
control of the current limiter further limits a current through the second current conduction path.

9. The circuit according to claim 7, wherein:
the replica circuit is a reduced-size replica of the second stage.

10. The circuit according to claim 7, wherein:
the first stage is configured to provide an input to the second stage.

11. The circuit according to claim 10, wherein:
the second stage is an output stage of the amplifier that is configured to provide an output of the amplifier.

12. The circuit according to claim 7, wherein:
the second stage comprises a common-source FET transistor in series-connection with a current source, and
the replica circuit comprises a reduced-size common-source FET transistor in series-connection with a reduced-size current source.

13. The circuit according to claim 7, wherein:
input to the second stage and the replica circuit is provided at the sensing node.

14. The circuit according to claim 13, wherein:
the clamp sense circuit is configured to detect an output clamp condition of the second stage, the output clamp condition provided by a substantially fixed output voltage of the second stage for an increasing voltage at the sensing node.

15. The circuit according to claim 14, wherein:
the replica circuit is configured to output a decreasing voltage for the increasing input voltage at the sensing node.

16. The circuit according to claim 14, wherein:
the output of the replica circuit is decoupled from the output of the second stage.

17. The circuit according to claim 16, wherein:
the output of the replica circuit is coupled to the current limiter.

18. The circuit according to claim 1, wherein:
the circuit further comprises a feedback circuit coupled between an output and an input of the amplifier.

19. The circuit according to claim 1, wherein:
the circuit comprises metal-oxide-semiconductor (MOS) field effect transistors (FETs), or complementary metal-oxide-semiconductor (CMOS) field effect transistors (FETs).

20. The circuit according to claim 19, wherein:
said transistors are fabricated using one of: a) silicon-on-insulator (SOI) technology, and b) silicon-on-sapphire technology (SOS).

21. An amplifier with clamp current limiter circuit, comprising:
an amplifier circuit according to the circuit of claim 1; and
a clamp circuit coupled to an output of the amplifier circuit,
wherein
the clamp circuit is configured to clamp the output of the amplifier circuit when a non-compliant input is provided to the amplifier circuit.

22. The amplifier with clamp current limiter circuit of claim 21, wherein:
the non-compliant input is an input that is out of range with respect to an input voltage range of the amplifier circuit.

23. The amplifier with clamp current limiter circuit of claim 21, wherein:
the non-compliant input is an input that is out of range with respect to a linear region of operation of the amplifier circuit.

* * * * *